United States Patent
Horikoshi

(10) Patent No.: US 9,581,896 B2
(45) Date of Patent: Feb. 28, 2017

(54) AGGLUTINANT FOR PELLICLE AND A PELLICLE INCLUDING THE SAME

(71) Applicant: SHIN-ETSU CHEMICAL CO., LTD., Tokyo (JP)

(72) Inventor: Jun Horikoshi, Annaka (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 109 days.

(21) Appl. No.: 14/658,672

(22) Filed: Mar. 16, 2015

(65) Prior Publication Data

US 2015/0286134 A1    Oct. 8, 2015

(30) Foreign Application Priority Data

Apr. 4, 2014 (JP) .................................. 2014-77531

(51) Int. Cl.
| | | |
|---|---|---|
| *G03F 1/62* | (2012.01) | |
| *G03F 1/64* | (2012.01) | |
| *C09K 11/06* | (2006.01) | |
| *G03F 1/00* | (2012.01) | |

(52) U.S. Cl.
CPC ................. *G03F 1/64* (2013.01); *C09K 11/06* (2013.01); *G03F 1/142* (2013.01); *G03F 1/62* (2013.01); *C09K 2211/1011* (2013.01); *C09K 2211/1033* (2013.01)

(58) Field of Classification Search
CPC .............. G03F 1/142; G03F 1/62; G03F 1/64; G09K 11/06
USPC .......................................................... 430/5
See application file for complete search history.

(56) References Cited

U.S. PATENT DOCUMENTS

| | | | |
|---|---|---|---|
| 2,387,512 A | 10/1945 | Hilberg | |
| 8,158,517 B2 * | 4/2012 | Yamamoto | .......... H01L 27/1292 257/E21.174 |
| 9,310,673 B2 * | 4/2016 | Yano | ....................... C09J 133/08 |
| 2012/0122024 A1 | 5/2012 | Shirasaki | |

FOREIGN PATENT DOCUMENTS

| | | |
|---|---|---|
| EP | 0 893 736 A1 | 1/1999 |
| JP | 58-219023 A | 12/1983 |
| JP | 63-27707 B2 | 6/1988 |
| JP | 2007-010786 A | 1/2007 |
| JP | 2012-108277 A | 6/2012 |
| WO | 2012/157759 A1 | 11/2012 |

OTHER PUBLICATIONS

European Search Report (ESR) dated Jun. 10, 2016, issued in counterpart European Patent Application No. 15157728.5. (7 pages).

\* cited by examiner

*Primary Examiner* — Christopher Young

(74) *Attorney, Agent, or Firm* — Westerman, Hattori, Daniels & Adrian, LLP

(57) ABSTRACT

There is provided a pellicle 1 for lithography having a frame 12, a film 11 and an agglutinant layer 13 (an adhesive to bond the pellicle on a photomask), in which the agglutinant layer 13 is doped with a luminescence material so as to facilitate the inspection of the quality of the adhesion between the agglutinant layer 13 and the photomask; preferably the luminescence material is a kind that glows in response to UV irradiation, and a preferable dosage of the luminescence material is no less than 0.01 mass % but less than 1.0 mass %.

9 Claims, 1 Drawing Sheet

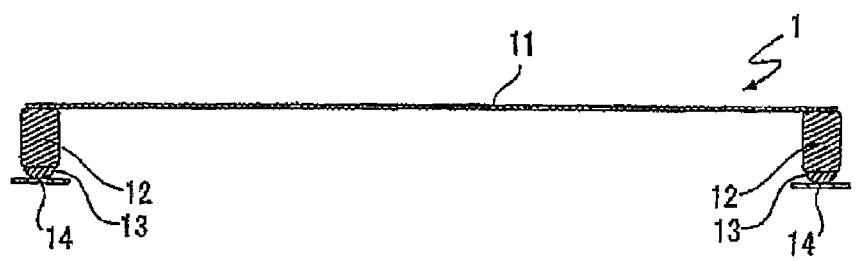

AGGLUTINANT FOR PELLICLE AND A PELLICLE INCLUDING THE SAME

PRIORITY CLAIMED

The present non-provisional application claims priority, as per Paris Convention, from Japanese Patent Application No. 2014-077531 filed on Apr. 4, 2014, the disclosure of which is hereby incorporated by reference herein in its entirety.

FIELD OF TECHNOLOGY

The present invention relates to a pellicle for lithography, which is used to fend off dust during a process of manufacturing a semiconductor device, a printed circuit board, or a liquid crystal display panel, and in particular it relates to an agglutinant used for bonding the pellicle to a stencil such as a photomask.

BACKGROUND OF THE INVENTION

In the manufacture of a semiconductor device such as a large scale integrated circuit (LSI) and a very large scale integrated circuit (VLSI), or a liquid crystal display panel, a pattern is made by irradiating a light to a semiconductor wafer or an original plate for liquid crystal, but if a dust is attached a photomask or a reticle (hereinafter collectively referred to as "photomask" for simplicity) which is used during the irradiation operation, the dust causes the pattern to have roughened edges or black stains on a base, and thus leads to problems such as damaged dimensions, poor quality, and deformed external appearance.

In order to prevent these problems, the operation of exposing the wafer or substrate is generally conducted in a clean room. However, even so, it is not always easy to keep the photomask dust-free, and hence in order to fend off the dust from the surface of the photomask, a pellicle is attached to cover the exposure photomask. In this manner, the dust is prevented from reaching the surface of the photomask but can only alight on the pellicle membrane so that, if the exposure light is set to focus on the pattern of the photomask, the dust on the pellicle membrane fails to shadow itself in the transferred pattern.

In general, a pellicle is made by tensely adhering a transparent pellicle film made of a highly light transmitting material such as cellulose nitrate, cellulose acetate, fluorine-containing polymer and the like to one of the two annular frame faces of a pellicle frame made of aluminum, stainless steel, polyethylene or the like, using as the glue either a solvent capable of dissolving the pellicle film, which is applied to said annular frame face (hereinafter this face is called "upper frame face") and then air-dried before receiving the film (ref. IP Publication 1), or an adhesive such as acrylic resin, epoxy resin or the like (ref. IP Publication 2). The other annular frame face (hereinafter called "lower frame face") of the pellicle frame is paved with an agglutinant made of polybutene resin, polyvinyl acetate resin, acrylic resin, silicone resin or the like for attaching the pellicle frame to a photomask, and over this agglutinant layer is laid a release liner (tape) to protect the agglutinant layer.

This pellicle is glued to a photomask (a substrate made of a transparent material such as glass) via the aggluntiant layer so as to prevent a foreign particle from adhering to the pattern on the photomask; however, if the agglutinant layer is not completely laid on the photomask but is broken to allow a formation of a leak passage, then a foreign particle could enter the inner space of the pellicle through the leak passage and could affect the pattern on the photomask.

In order to secure that the agglutinant layer of the pellicle is leaklessly bonded to the photomask, one can increase the bonding pressure and/or the length of the pressure application time. But in recent years, the tendency has been such that, when the pellicle is being bonded to the photomask, the bonding pressure is kept relatively low so as to prevent the pattern on the photomask from undergoing deformation, and that the pressure application time is decreased so as to shorten the manufacturing time. For example, IP Publication 3 describes a pellicle for lithography wherein the flatness of the agglutinant layer is heightened and its adhesive strength is reduced to a range of 1 N/m-100 N/m so as to prevent the photomask from deforming.

PRIOR ART LITERATURE

IP Publications

[IP Publication 1]
Japanese Patent Application Publication S58[1983]-219023
[IP Publication 2]
Japanese Pre-Patent Publication for Public Review S63 [1988]-27707
[IP Publication 3]
Japanese Patent Application Publication 2012-108277

SUMMARY OF THE INVENTION

Problems the Invention Seeks to Solve

However, notwithstanding these counter-measures, if even a small unevenness exists in the height of the agglutinant layer, or if even a slight unevenness exists in the width of the agglutinant layer, or if the angle between the pellicle and the photomask as of the time of bonding is not appropriate, there is a possibility that the agglutinant fails to be leaklessly laid so that a leak passage may be created.

In a case in which the photomask is made of a transparent material such as glass, it is possible to inspect whether or not a leak passage is formed after the agglutinant layer is bonded on the photomask, by viewing that face of the agglutinant layer which is in contact with the photomask through the transparent photomask; however even if the photomask is a transparent glass substrate, for example, if one face of the substrate is coated with a metal deposition, it is not possible to conduct such inspection for a leak passage.

It is not impossible to inspect for a leak passage by viewing from a side face of the photomask, but the thickness of the agglutinant layer is only 1 mm or smaller so that, if a condensing light source lamp is used for the inspection, what with the reflection light and the refracted light from the agglutinant layer and what with the reflected light from the deposited metal layer of the glass substrate, it is impossible to obtain a trustworthy view of how the agglutinant layer is attached to the photomask.

It is this inconvenience that motivated the present invention and it is an object of the invention to propose an agglutinant for pellicle which allows an operator to easily obtain an accurate view of how the agglutinant layer is bonded to a glass substrate, and the also the present invention proposes a pellicle with such an agglutinant.

The present inventors made efforts to solve the above-stated problem, and eventually found that it is possible to obtain an accurate view of how the agglutinant layer is bonded to the glass substrate if the agglutinant layer is doped with a luminescence material, for the reason that such agglutinant layer emits a bluish white light when the agglutinant layer is exposed to an ultraviolet ray—hence the possession of the invention.

Means to Solve the Problems

Hence, the present invention relates to an agglutinant for pellicle as well as a pellicle using such an agglutinant, which (pellicle) comprises a pellicle film and a pellicle frame to which the pellicle film is adhered, and the agglutinant forms a layer by which the pellicle is bonded to a glass substrate, and this agglutinant is characteristic in that it contains a luminescence material.

The content of the luminescence material in the agglutinant is preferably 0.01 mass % through 1.0 mass %; and the luminescence material is preferably a kind that emits fluorescence when exposed to an ultraviolet ray. A more preferable example is an oxazole-based material. With respect to the agglutinant of the present invention to which the luminescence material is added, silicone-based agglutinant as well as acrylic agglutinant are preferable.

Effect of the Invention

In accordance with the present invention, it is possible to conduct the inspection of how the pellicle agglutinant layer is bonded to the glass substrate with ease and accuracy.

BRIEF DESCRIPTION OF DRAWING

FIG. 1 is a longitudinal cross section of a pellicle of the present invention wherein the agglutinant used is one that contains a luminiscense material.

EXAMPLES TO EMBODY THE INVENTION

We will now explain in detail how the present invention can be embodied, with reference to the drawing, but the invention is not limited to such embodiments.

FIG. 1 is a longitudinal cross section of an example of the pellicle of the present invention, wherein an agglutinant doped with a luminiscense material is used. This pellicle 1 of FIG. 1 has a frame 12, which ordinarily has a quadrilateral shape (rectangular or square) to meet the shape of the base plate (photomask or its glass substrate), to which the pellicle 1 is to be affixed, and a pellicle film 11 is tensely adhered to the upper face of the pellicle frame 12 by means of an adhesive; an agglutinant layer 13 is provided to the lower frame face of the frame 12 by which the pellicle is glued to the base plate. Also, a liner (separator) 14 is releasably attached to the agglutinant's lower face so as to protect the agglutinant layer 13.

Now, there is no particular limitation as to the material of the pellicle film 11 and that of the pellicle frame 12, and any known conventional ones may be used; however, as for the pellicle frame 12, a metallic one is preferable adopted in view of the rigidity and machinability. The pellicle film 11 may be adhered to the pellicle frame 12 by any known method.

The agglutinant layer 13 of the present invention is laid on the lower frame face of the pellicle frame 12 and is made to have a predetermined width (usually equivalent to or slightly smaller than that of the lower frame face of the pellicle frame 12) and is extended endlessly round the endless lower frame face in a manner such that there occurs no seam in the agglutinant layer when the pellicle frame 12 is adhered to the base plate.

The agglutinant layer of the present invention can be made of any conventionally used material, but a silicone-based agglutinant and acrylic agglutinant are preferable. Examples of silicone-based agglutinant include silicone agglutinants (adhesives) X-40-3122, KR-3700, X-40-3103, and X-40-3264 (which are commercially available produces of Shin-Etsu Chemical Co., Ltd.). Of these X-40-3122 is the most preferable on account of its high adhesion strength and reduced content of low molecular siloxane.

As for the acrylic agglutinant, it is possible to use an acrylic agglutinant (selected from SK Dyne Series, which are commercially available from Soken Chemical Co., Ltd.); of these SK-1495 is the most preferable on account of its adhesive strength and workability.

The agglutinant of the present invention contains a luminescence material, and this luminescence material can be any material that emits fluorescence. Examples of natural luminescence material include calcite, willemite, sprite, fluorite and diamond. Also there are artificial luminiscense materials which are used to render materials look whiter, as long-wave ultraviolet ray hits the material and reflect as blue-color light.

Typical examples of luminescence material are a disulfonate, a tetrasulfonate, a hexasulfonate, a stilbene, an imidazole, a thiazole, an oxazole, a triazole, an oxadiazole, a thiadiazole, a coumarin, a naphthalimido, a pyrazoline, a pyrene, a imidazolone, a benzidine, a diaminocarbazole, an oxacyanin, a methine, a pyridine, an anthrapyridazine, a distyryl, a carbostyaryl, and a biphenyl. These luminescence materials can be used singly or in combinations; in a preferable mode an oxazole is used.

Commercially identifiable examples of the luminescence material include Uvitex-OB, Uvitex-EBF, Uvitex-ERN-P, Uvitex-EHF, Uvitex-EMT and Uvitex-EM-V (which are oxazoles) and Uvitex-ERT and Uvitex-WGS (which are coumarins), Uvitex-AT and Uvitex-BAC (which are imidazole), Uvitex-WG (which is a pyrazoline), Uvitex-2B, Uvitex-BHT, Uvitex-MST and Uvitex-CF (which are stilbenes) and Uvitex-NFW (which is a biphenyl); all of these are products of Ciba-Geigy Corporation.

Other examples include products of Shin-Nisso Kako Co., Ltd., such as, Kayacall-BSconc, Kayacall-Blconc, Kayacall-BIL, Kayacall-BRA, Kayacall-BRAL, Kayacall-BR-BLconc, Kayacall-BUL, Kayacall-BXconc, Kayacall-BXNL, Kayacall-BZconc, Kayacall-BZH/C, Kayacall-BZL, Kayacall-Caconc, Kayacall-CPL, Kayacall-KTL, Kayacall-PAN, Kayacall-PKconc, Kayacall-RG, Kayacall-RP, Kayacall-SR, Kayacall-WG, Kayacall-WS, Kayacall-WSL-100, Kayacall-E, and Kayacall-C.

Furthermore, it is possible to adop Kayalight OSR, Kayalight OS and Kayalight B (products of Nippon Kayaku Co., Ltd.) and Eastobrite OB-1 (a product of Eastman Chemical Company) is also commercially available.

These luminescence materials are capable to emitting a light of a wavelength range of 400-500 nm after receiving an ultraviolet ray of wavelength range of 340-400 nm. For example, Uvitex-OB, which is an oxazole, generates a strong bluish white light, upon being shot with 340-nm-wavelength near ultraviolet ray. These luminescence materials are normally mixed at a concentration of one mass % or smaller, preferably 0.01 through one mass %. When mixed at a concentration of over one mass %, the luminiscence material is liable to educe from the surface of the agglutinant layer, and if the concentration is lower than 0.01 mass %, enough luminiscent effect may not be obtained.

According to the present invention, the agglutinant layer is doped with an luminescence material so that when the aggloutiant layer is irradiated with ultraviolet ray it emits bluish-white light. Hence, even when a pellicle is bonded to a glass substrate which is coated with a deposited metal, if the pellicle is equipped with the agglutinant layer containing a iluminiscence material, the agglutinant layer glows in bluishi-white color when the layer is irradiated with ultraviolet ray in a dark room. Therefore, it is possible to recognize the boundary between the glass substrate and the agglutinant layer with ease so that it becomes possible to accurately and easily inspect how the agglutinant layer is bonded to the glass substrate including whether or not there is a leak passage.

In the present invention it is possible to add one or more other ingredients to the agglutinant inasmuch as the adhesion strength of the agglutinant is not affected. For example, depending on the purpose, one can add a releasing agent, a pigment, a dye, a plasticizer, a flame retardant, a heat resistance improver, a weather resistance improving agent, a thixotropy-imparting agent, an antimicrobe agent, an antimold agent or the like.

Many of the luminscence materials that can be added to the agglutinant layer for the purpose of the present invention are powder so that, if need be, they can be first dissolved into a solvent and then this solution can be added to the agglutinant; such solvent may be selected from, or prepared by mixing two or more of, an aromatic solvent such as toluene and xylene, an aliphatic solvent such as hexane, octane, isooctane and isoparaffin, a ketones solvent such as methyethylketone and methylisobutylketon, an ester solvent such as ethyl acetate and butyl acetate and an ethers solvent such as diisopropyl ether and 1,4-dioxane.

The agglutiant of the present invention can be diluted with a solvent, if necessary, before being applied to the lower frame face of the pellicle frame 12. The agglutinant can be applied in ways such as brush coating, spraying and automatic dispensing. The agglutinant layer 13 is formed as the agglutinant is consolidated by curing with heat and by drying, after the application.

The release liner 14 (separator) is provided on the agglutinant layer 13 to protect the agglutinant layer 13 and it is not removed until the pellicle 1 is bonded to the glass substrate. For this reason, the release liner 14 (separator) is provided only in cases where the agglutinant layer 13 needs to be protected until the pellicle 1 is put in use.

In general the pellicle 1 circulated as a product in the market comes with the release liner 14 (separator). In this case, the material to make the release liner 14 (separator) is not limited, and may be any conventionally used one, and the attachment of the liner can be effected by any known method.

EXAMPLES

Next, detailed description of the examples and comparative examples for the present invention follow.

Example 1

At first, a rectangular pellicle frame 12 of an aluminum alloy (whose outer periphery measured 149 mm×122 mm, height 5.8 mm, and width 2 mm) was transported into a clean room, where it was washed with a neutral detergent and pure water thoroughly and dried. The agglutinant doped with luminescence material was prepared in the following manner: a hundred mass parts of silicone agglutinant X-40-3122 (a product name of a silicone agglutinant manufactured by Shin-Etsu Chemical Co., Ltd.) was mixed with one mass part of a solution which consists of 98 mass % toluene and 2 mass % Uvitex-OB (product of Ciba-Geigy Corporation), with a result that Uvitex-OB constitutes 0.02 mass % of the resultant agglutinant.

Next, thus prepared agglutinant was applied to the lower frame face of the pellicle frame 12 by means of an automatic dispenser (not shown; manufactured by Iwashita Engineering Inc.). Thereafter, the agglutinant was dried by air flow until the agglutinant stopped flowing; the pellicle frame 12 was heated to a temperature of 130 degrees C. by a high frequency induction heating equipment (not shown), and thus the agglutinant layer was hardened to form the agglutinant layer 13. Also, a pellicle film 11 was adhered to the upper frame face of the pellicle frame 12 by means of an adhesive CYTOP CTX-A (a trade name of a product manufactured by Asahi Glass Co., Ltd.), and the extra portion of the film that extends beyond the frame was trimmed off by a cutter, whereby a pellicle 1 was completed.

Example 2

In Example 2, an agglutinant was prepared in the following manner: a hundred mass parts of acrylic agglutinant SK-1425 (a product name of an acrylic agglutinant manufactured by Soken Chemical & Engineering Co., Ltd.) was mixed with one mass part of a solution which consists of 98 mass % toluene and 2 mass % Uvitex-OB, with a result that the latter constitutes 0.02 mass % of the resultant agglutinant. Thereafter, the same procedures as in Example 1 were conducted except for the kind of the agglutinant, and a pellicle 1 was completed.

Comparative Example 1

In Comparative Example 1, X-40-3122 was used as the agglutinant and no luminescence material was added to it. Then, the same procedures as in Example 1 were conducted except that the agglutinant used was without luminescence material, and a pellicle 1 was completed.

Comparative Example 2

In Comparative Example 2, SK-1425 was used as the agglutinant and no luminescence material was added to it. Then, the same procedures as in Example 2 were conducted except that the agglutinant used was without luminescence material, and a pellicle 1 was completed.

Next, with respect to Example 1, Example 2, Comparative Example 1 and Comparative Example 2, the manner in which the adhesive layer is adhered to a glass substrate was inspected in regard to the following aspects.

[Inspection of the Adhesion Quality Using a Condensing Light Source Lamp]

In a dark room where the intensity of illumination was 10 lux or lower, a light was irradiated into a side face of the glass substrate, to which the pellicle 1 is adhered, from a 400,000-lux condensing light source lamp (manufactured by Yamada Optics Industry Co., Ltd.) in a manner such that the light reaches a part where the agglutinant layer meets the glass substrate, and the quality of the adhesion between the agglutinant layer and the glass substrate was visually inspected. Now, in order to make sure that this inspection method is trustworthy in detecting a defect, the inspection was conducted not only on a situation where the agglutinant was properly adhered to the glass substrate, but also on a situation where the agglutinant layer was adhered in a manner such that a leak passage was intentionally created between the pellicle agglutinant and the glass substrate.

[Inspection of the Adhesion Quality Using an Ultraviolet Irradiation]

In a dark room where the intensity of illumination was 10 lux or lower, a 340-nm near-ultraviolet radiation was irradiated into a side face of the glass substrate, to which the pellicle 1 is adhered, from a lamp in a manner such that the radiation reaches a part where the agglutinant layer meets the glass substrate, and the quality of the adhesion between the agglutinant layer and the glass substrate was visually inspected. This inspection was also conducted on both situations where the leak passage was either intentionally created or not. The result of these inspections is shown in Table 1.

TABLE 1

|  |  | Example 1 | Example 2 | Comparative Example 1 | Comparative Example 2 |
|---|---|---|---|---|---|
| Irradiation by condensing light source lamp | properly adhered | ND | ND | ND | ND |
|  | leak passage intentionally created | ND | ND | ND | ND |
| Irradiation by ultraviolet radiation | properly adhered | luminescence indicated there was no leak passage | luminescence indicated there was no leak passage | not detectable owing to no luminescence in response to UV radiation | not detectable owing to no luminescence in response to UV radiation |
|  | leak passage intentionally created | luminescence indicated there was a leak passage | luminescence indicated there was a leak passage | not detectable owing to no luminescence in response to UV radiation | not detectable owing to no luminescence in response to UV radiation |

In Table 1, "ND" indicates that the reflected light and the refracted light from the agglutinant layer and the reflected light from the glass substrate interfered so much that it was impossible to detect whether a leak passage was created or not.

As is seen from the results entered in Table 1, if an agglutinant containing luminescence material of the present invention is used, it is possible to obtain an accurate information regarding the quality of the adhesion between the agglutinant layer and the photomask with ease, even when one face of the photomask is coated with a metal deposition defying the conventional inspection method, since it is now possible to conduct an accurate inspection with UV radiation irradiated into a side face, rather than the main face, of the photomask.

REPRESENTATION OF REFERENCE NUMERALS

1: pellicle
11: pellicle film
12: pellicle frame
13: agglutinant containing luminescence material
14: release liner (separator)

What is claimed is:

1. An agglutinant for pellicle, wherein the agglutinant contains a luminescence material which emits light when irradiated with UV radiation, the luminiscence material comprising at least one selected from the group consisting of calcite, willemite, sprite, fluorite, diamond, a disulfonate, a tetrasulfonate, a hexasulfonate, a stilbene, an imidazole, a thiazole, an oxazole, an oxadiazole, a thiadiazole, a coumarin, a naphthalimido, a pyrazoline, a pyrene, a imidazolone, a benzidine, a diaminocarbazole, an oxacyanin, a methine, a pyridine, an anthrapyridazine, a distyryl, a carbostyaryl, and a biphenyl.

2. An agglutinant for pellicle as claimed in claim 1, wherein a content of said luminescence material is no less than 0.01 mass % but less than 1.0 mass %.

3. An agglutinant for pellicle as claimed in claim 1, wherein said agglutinant comprises a silicone-based agglutinant or an acrylic agglutinant.

4. A pellicle comprising a pellicle frame having two frame faces, a pellicle film adhered to one of said frame faces, and an agglutinant layer attached to the other one of said frame faces; wherein said agglutinant layer comprises the agglutinant according to claim 1.

5. A pellicle as claimed in claim 4, wherein a content of said luminescence material is no less than 0.01 mass % but less than 1.0 mass %.

6. A pellicle as claimed in claim 4, wherein said luminescence material emits light when irradiated with UV radiation.

7. A pellicle as claimed in claim 4, wherein said luminescence material is an oxazole-based material.

8. A pellicle as claimed in claim 4, wherein said agglutinant comprises a silicone-based agglutinant or an acrylic agglutinant.

9. A method of inspecting bonding of pellicle by an agglutinant, comprising:
   providing an pellicle comprising
      a pellicle frame having first and second frame faces, and
      a pellicle film adhered to the first frame face;
   applying an agglutinant on the second frame face, the agglutinant containing a luminescence material;
   inspecting bonding of pellicle by irradiating the agglutinant with an ultraviolet light.

* * * * *